(12) United States Patent
Corisis et al.

(10) Patent No.: US 7,151,013 B2
(45) Date of Patent: Dec. 19, 2006

(54) SEMICONDUCTOR PACKAGE HAVING EXPOSED HEAT DISSIPATING SURFACE AND METHOD OF FABRICATION

(75) Inventors: David J. Corisis, Meridian, ID (US); Mike Brooks, Caldwell, ID (US); Mark S. Johnson, Boise, ID (US); Larry D. Kinsman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 247 days.

(21) Appl. No.: 10/260,615

(22) Filed: Oct. 1, 2002

(65) Prior Publication Data

US 2003/0030152 A1 Feb. 13, 2003

Related U.S. Application Data

(62) Division of application No. 09/874,011, filed on Jun. 6, 2001, now Pat. No. 6,541,856.

(51) Int. Cl.
*H01L 21/44* (2006.01)
(52) U.S. Cl. ............... 438/127; 438/122; 438/124; 257/666; 257/787; 257/E25.011
(58) Field of Classification Search ............... 257/676, 257/686, 724, 787, 666, E25.011; 438/127
See application file for complete search history.

(56) References Cited

U.S. PATENT DOCUMENTS

| | | | |
|---|---|---|---|
| 5,177,669 A | 1/1993 | Juskey et al. | |
| 5,200,809 A | 4/1993 | Kwon | |
| 5,299,092 A * | 3/1994 | Yaguchi et al. | 361/728 |
| 5,450,283 A | 9/1995 | Lin et al. | |
| 5,604,376 A | 2/1997 | Hamburgen et al. | |
| 5,804,874 A * | 9/1998 | An et al. | 257/676 |
| 5,843,807 A | 12/1998 | Burns | |
| 5,894,108 A | 4/1999 | Mostafazadeh et al. | |
| 5,901,041 A | 5/1999 | Davies et al. | |
| 6,049,123 A | 4/2000 | Burns | |
| 6,303,981 B1 * | 10/2001 | Moden | 257/666 |
| 6,426,560 B1 * | 7/2002 | Kawamura et al. | 257/777 |
| 6,545,345 B1 * | 4/2003 | Glenn et al. | 257/676 |

* cited by examiner

*Primary Examiner*—Kenneth Parker
*Assistant Examiner*—José R. Diaz
(74) *Attorney, Agent, or Firm*—Dickstein Shapiro LLP (57) ABSTRACT

A high density semiconductor package with thermally enhanced properties is described. The semiconductor package includes a pair of lead frames, each being attached to a respective semiconductor die. The dies are attached to respective lead frames via an adhering material, such as a tape. Further, the dies are each electrically connected to fingers of each lead frame. In one illustrated embodiment, the dies and portions of the fingers are encapsulated in such a way as to leave one surface of each die exposed. In another illustrated embodiment, heat dissipation for the semiconductor package occurs through exposed fingers of the lead frames which adhere semiconductor dies within a cavity located therebetween.

6 Claims, 7 Drawing Sheets

SEMICONDUCTOR PACKAGE HAVING EXPOSED HEAT DISSIPATING SURFACE AND METHOD OF FABRICATION

This application is a divisional of application Ser. No. 09/874,011, filed on Jun. 6, 2001, now U.S. Pat. No. 6,541,856 the entire disclosure of which is hereby incorporated by reference.

FIELD OF THE INVENTION

The present invention relates to high density semiconductor packages. More particularly, the present invention relates to high density semiconductor packages and methods for making them.

BACKGROUND

Semiconductor packaging techniques are well known. In conventional packaged devices, a die is attached to a substrate, such as, for example, a lead frame, and contacts of the die and lead frame are electrically connected together. A heat sink may also be affixed to the die. The die and heat sink are then completely encapsulated, using an overmold (a heated container with a cavity), with a molded plastic material. An example of such a conventional packaged device may be found in U.S. Pat. No. 5,901,041 (Davies et al.).

Other conventional methodologies include mounting and electrically connecting a semiconductor die to a lead frame and also incorporating heat conductive areas, such as columns, to assist in removing heat from the semiconductor die. The semiconductor die, the heat conductive columns, and a portion of the lead frame are then encapsulated. An example of such a conventional packaged device may be found in U.S. Pat. No. 5,200,809 (Kwon).

Yet other conventional methodologies include packaging the die so as to leave one surface exposed. Examples of such conventional die packages may be found in U.S. Pat. No. 5,894,108 (Mostafazadeh et al.), U.S. Pat. No. 5,604,376 (Hamburgen et al.), U.S. Pat. No. 5,450,283 (Lin et al.), and U.S. Pat. No. 5,177,669 (Juskey et al.).

All of the aforementioned conventional semiconductor packages include a single semiconductor die which is either partially or completely encapsulated with a molded plastic material. Other conventional semiconductor packages include more than one semiconductor die encapsulated by a molded plastic material. Examples of such high density semiconductor packages may be found in U.S. Pat. No. 5,843,807 (Burns) and U.S. Pat. No. 6,049,123 (Burns). One disadvantage of the high density semiconductor packages described in Burns is that the overall package thickness is relatively large, whereas thinner high density packages would be preferable.

What is needed is a relatively thin a high density semiconductor package which has good heat dissipation characteristics.

SUMMARY

The invention provides a relatively thin high density semiconductor package having good heat dissipation characteristics. The package includes a first and a second lead frame, each lead frame including a plurality of fingers, a first and a second semiconductor die electrically connected to the lead frames, and an encapsulating material partially encapsulating the fingers and the semiconductor dies in a manner which leaves surfaces of the semiconductor dies exposed.

The invention further provides a method of fabricating a high density semiconductor package. The method includes the acts of attaching a first semiconductor die to a first lead frame and a second semiconductor die to a second lead frame, each lead frame including a plurality of fingers, electrically connecting the fingers of the first lead frame to the first semiconductor die and the fingers of the second lead frame to the second semiconductor die, and encapsulating portions of the fingers and the semiconductor dies in a manner which leaves a surface of each semiconductor die exposed.

These and other advantages and features of the invention will be more readily understood from the following detailed description of the invention which is provided in connection with the accompanying drawings.

DETAILED DESCRIPTION OF PREFERRED EMBODIMENTS

Figure 1:
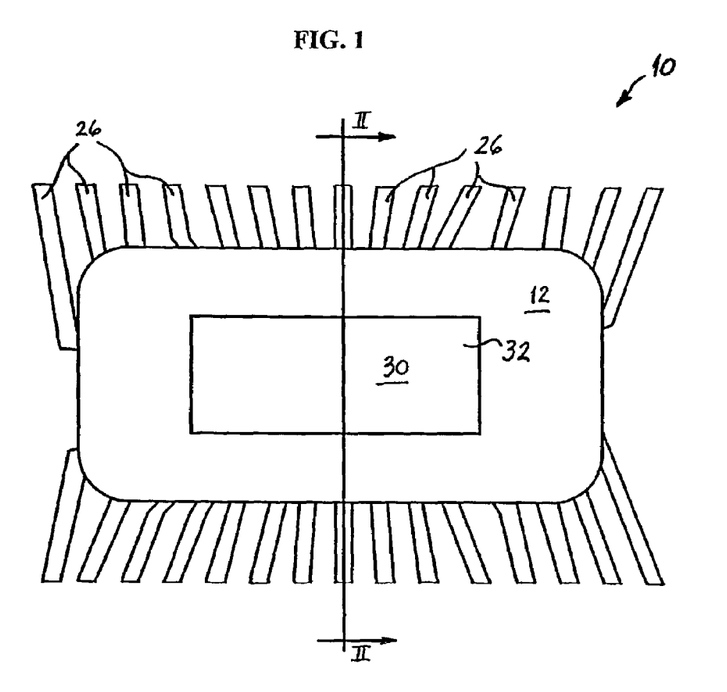
FIG. 1 is a top view of a high density semiconductor package constructed in accordance with an exemplary embodiment of the invention.
Figure 2:
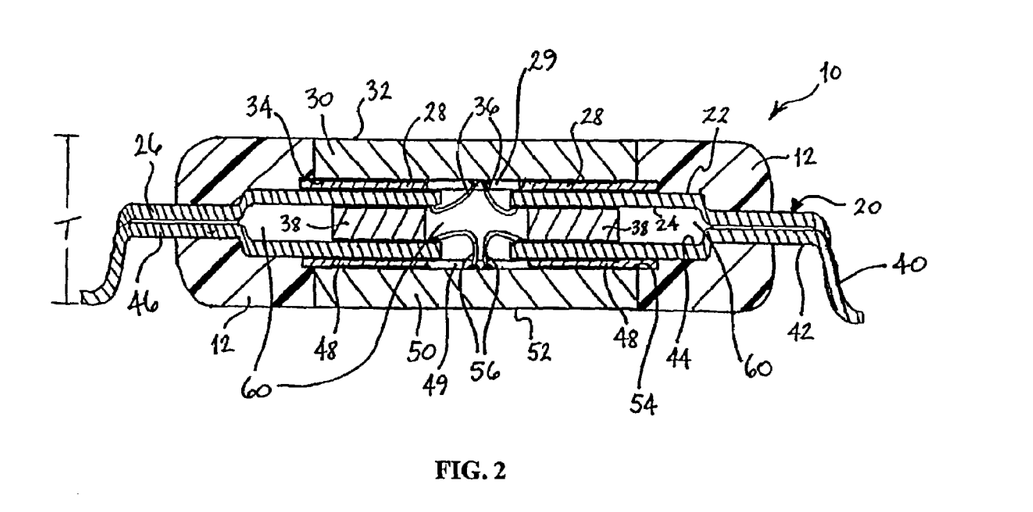
FIG. 2 is a cross-sectional view taken along line II—II of the semiconductor package of FIG. 1.

FIGS. 1–2 illustrate a high density semiconductor package 10 including a pair of semiconductor dies 30, 50 partially encapsulated within a molded plastic material 12, and a pair of lead frames 20, 40. The lead frame 20 includes a plurality of fingers 26 which have an outer surface 22 and an inner surface 24. Likewise, the lead frame 40 includes a plurality of fingers 46 extending therefrom. The lead frame 40 also has an outer surface 42 and an inner surface 44.

Each of the dies 30, 50 is attached to a respective lead frame 20, 40 through an adhering material, such as a tape. Specifically, the die 30 may be attached to the lead frame fingers 26 via a tape 28 having an opening 29 and the die 50 is attached to the lead frame fingers 46 via a tape 48 with an opening 49. Alternatively, the tape 28, 48 may include two parallel tape portions which extend substantially the length of the dies 30, 50 and which provide ample room between the tape portions for electrically connecting the dies 30, 50 to the lead frames 20, 40 (described in detail below).

Each of the dies 30, 50 includes a plurality of bonding sites for electrical connection to respective bonding sites on the lead frame fingers 26, 46. Specifically, as illustrated in FIG. 3C, die 30 includes a plurality of bonding pads 35, each of which is wire bonded with an electrical connector 36 to a respective finger 26. Though not illustrated, it is to be understood that die 50 may be similarly connected to the fingers 46, such as through electrical connectors 56 (FIG. 2).

Each of the dies 30, 50 has an exposed surface and an inner surface. Referring to the die 30, it includes an exposed surface 32 and an inner surface 34. The inner surface 34 is adhered to the tape 28. The die 50 has an exposed surface 52 and an inner surface 54 which is adhered to the tape 48.

One or more spacers 38 are positioned between the lead frame fingers 26,46 to provide a cavity 60. The spacers 38 provide structural strength to the package 10 before and during encapsulation. The cavity 60 provides adequate room for the electrical connectors 36, 56. Although two spacers 38 are illustrated, it is to be understood that one, three or more spacers may be positioned between the lead frames 20, 40.

Figure 3A:
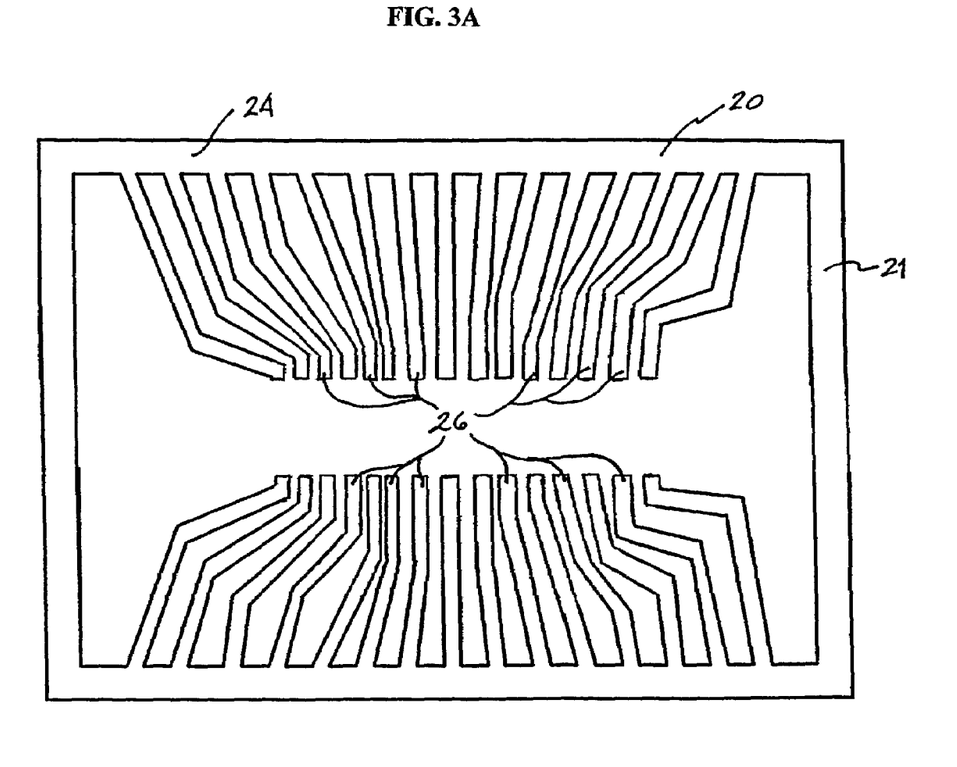
FIGS. 3A–3D illustrate various stages of assembly of the semiconductor package of FIG. 1.
Figure 3B:
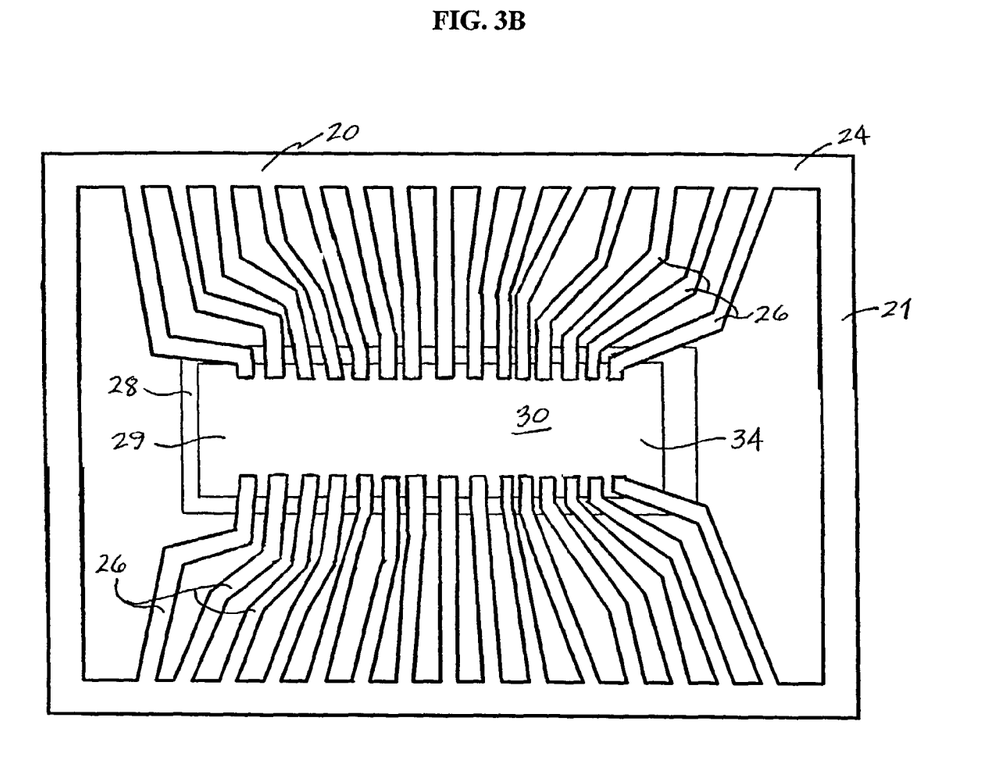
Figure 3C:
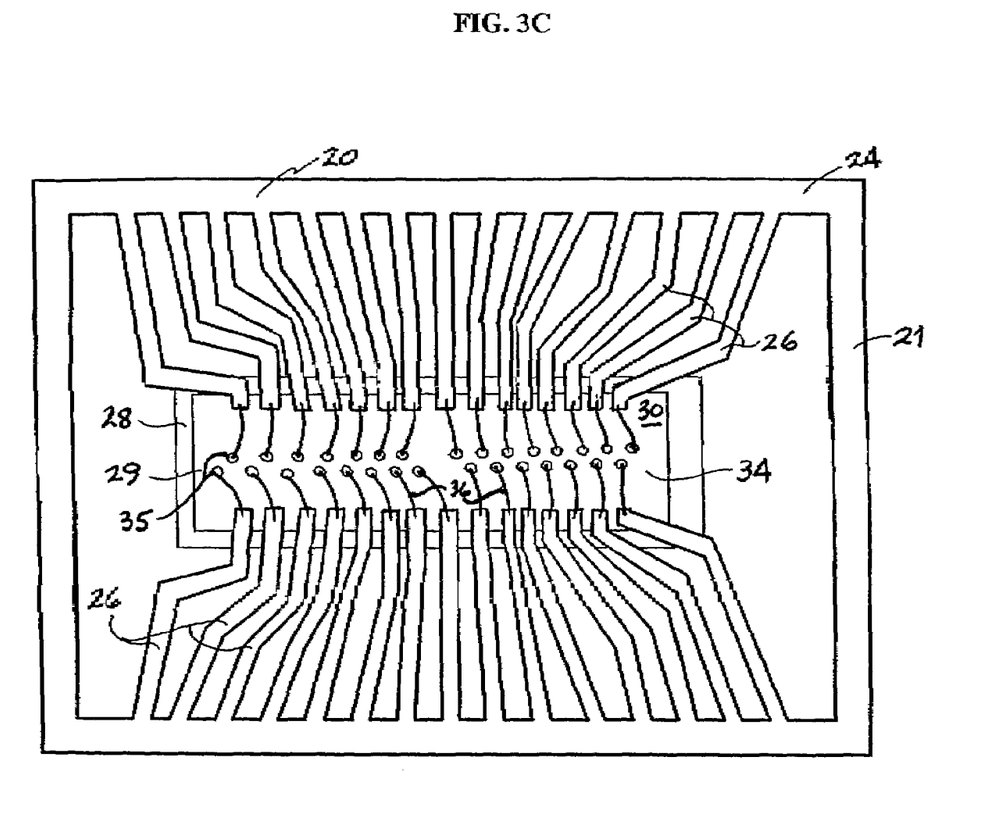
Figure 3D:
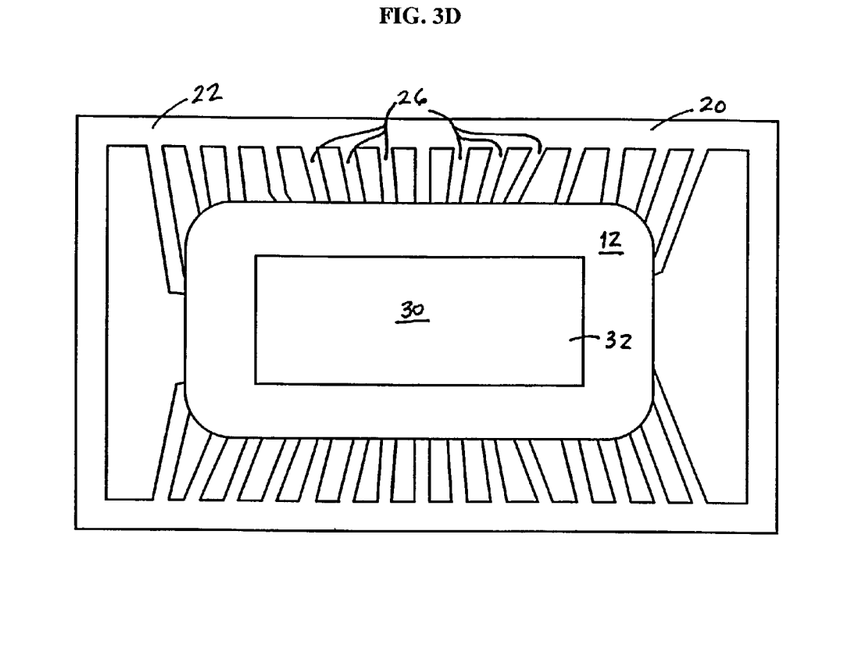

FIGS. 3A–3D and 4 illustrate the method of manufacturing the semiconductor package 10. Although FIGS. 3A–3C only show the lead frame 20 in various stages of fabrication (and not the lead frame 40), it is to be understood that the lead frame 40 is similarly fabricated, and the following description of the fabrication of the lead frame 20 is equally applicable to the fabrication of lead frame 40. As shown in FIG. 3A, a lead frame 20 is provided with an outer boundary 21 and inwardly extending fingers 26. A second lead frame 40 is likewise provided with an outer boundary and inwardly extending fingers 46. The positioning of the fingers 26 in FIGS. 3A–3D is merely illustrative, and it is to be understood that the fingers may form any configuration suitable for supporting a semiconductor die on a layer of tape.

Figure 4:
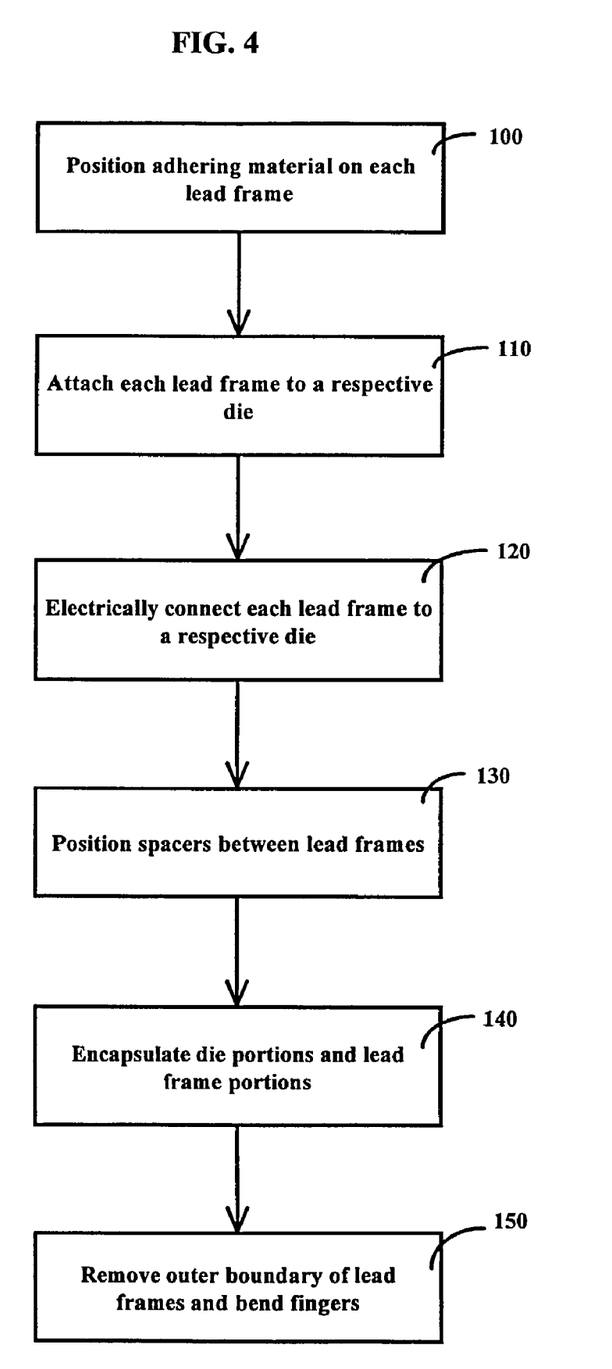
FIG. 4 is flow chart of steps used in manufacturing the semiconductor package of FIG. 1.

An adhering material, such as tape 28, is positioned on the lead frame 20 at step 100 (FIG. 4). Specifically, as shown in FIG. 3B the tape 28 is positioned within the outer boundary 21 and in contact with the fingers 26. The semiconductor die 30 is then attached to the tape 28 at step 110 such that the inner surface 34 contacts the tape 28. The semiconductor die 30 is so placed to allow electrical connection between its bond pads 35 and the fingers 26 through the cavity 29. The electrical connectors 36 are then wire bonded between the fingers 26 and the bond pads 35 at step 120 (FIG. 3C).

At step 130, the spacers 38 are positioned between the lead frames 20, 40. Alternatively, the spacers 38 could be pre-applied to one or both of the lead frames 20, 40. In particular, the spacers 38 are positioned between the inner surfaces 24 and 44 of, respectively, the lead frames 20 and 40 (FIG. 2). All portions of the semiconductor dies 30, 50 with the exception of the exposed surfaces 32, 52 are then encapsulated at step 140 with the molded plastic material 12. Thus, the surfaces 32, 52 remain exposed and provide a heat dissipating surface. Further, portions of the fingers 26,46 are encapsulated within the molded plastic material 12, leaving other finger portions exposed for providing electrical connection to circuit boards or sockets.

The spacers 38 keep open the cavity 60 which allows unfettered electrical connection between the bond pads 35 and the fingers 26. The cavity 60, and hence the electrical connectors 36 and the bond pads 35 are encased within the molded plastic material 12, which protects them against damage from corrosion and/or shock. With improvements in handling technology and encapsulation process technology, it may be possible to eliminate the spacers 38 completely.

The process for encapsulating the dies 30, 50 in the molded plastic material 12 is well known in the industry, and it may include placing the dies 30, 50 and their associated lead frames in a heated cavity and injecting the molded plastic material 12 in a semi-liquid or gel state into the heated cavity. The molded plastic material 12 then cures and hardens.

At step 150, the outer boundary 21 of the lead frame 20 and the outer boundary of the lead frame 40 are removed to expose ends of the fingers 26 and 46 which are protruding from the molded plastic material 12. The exposed ends of the fingers 26 and 46 may then be bent to provide leads for contacting the package 10 to a printed circuit board, socket or other mounting structure (not shown). Depending on the circuitry within the dies 30, 50, one or more of the fingers 26 and 46 may be connected together or may be left separated.

One advantage in stacking a pair of semiconductor dies as illustrated in FIGS. 1–2 is that such a semiconductor package 10 retains essentially the same thickness, configuration, and package outline as single die packages. Preferably, the semiconductor package 10 has a thickness T (FIG. 2) in the range of between about 1.175 millimeters and 1.26 millimeters. By retaining the same outline, the semiconductor package 10 can be tested using existing tools used for testing single die packages. Another advantage of the semiconductor package 10 is that leaving the surfaces 32, 52 exposed decreases package thickness while providing good heat dissipation. Another advantage is that the exposed surfaces 32, 52 each provide a surface upon which identifying marks and/or alphanumeric symbols may be formed.

Figure 5:
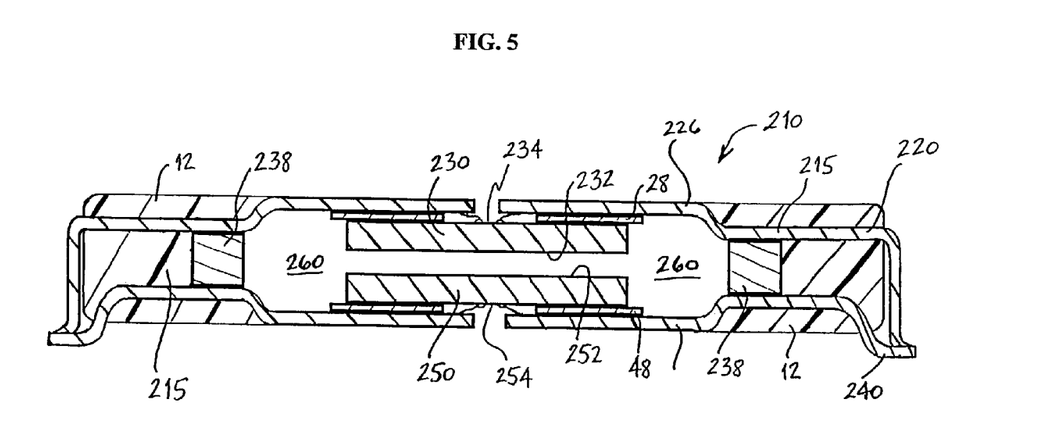
FIG. 5 is a cross-sectional view of a high density semiconductor package constructed in accordance with another embodiment of the invention.

An alternative embodiment of a high density semiconductor package is illustrated in FIG. 5. A semiconductor package 210 is shown including a first lead frame 220, a second lead frame 240, a first semiconductor die 230, and a second semiconductor die 250. The first semiconductor die 230 is attached to the first lead frame 220, and thee second semiconductor die 250 is attached to the second lead frame 240. As with the semiconductor package 10, the semiconductor package 210 has a thickness T in the range of between about 1.175 millimeters and 1.26 millimeters.

The first semiconductor die 230 includes a pair of opposing surfaces 232, 234. The first surface 232 remains uncovered, while a portion of the second surface 234 contacts the adhering material 28 to attach the first semiconductor die 230 to the first lead frame 220, and another portion of the second surface 234 is exposed. Likewise, the second semiconductor die 250 includes a pair of surfaces 252, 254. The surface 252 remains uncovered, while a portion of the other surface 254 contacts the adhering material 48 to attach the second semiconductor die 250 to the second lead frame 240, and another portion of the other surface 254 is exposed. In the FIG. 5 embodiment, heat dissipation of the semiconductor package 210 occurs through the exposed fingers 226, 246 of the lead frames 220, 240.

A pair of spacers 238 separate the two lead frames 220 and 240, providing a cavity 260 therebetween. Tab bonds connect bonding sites on the surface 234 of the first semiconductor die 230 to the first lead frame 220, and tab bonds connect bonding sites on the surface 254 of the second semiconductor die 250 to the second lead frame 240. Finally, the encapsulating molded plastic material 12 encapsulates a periphery 215 of the package 210.

Figure 6:
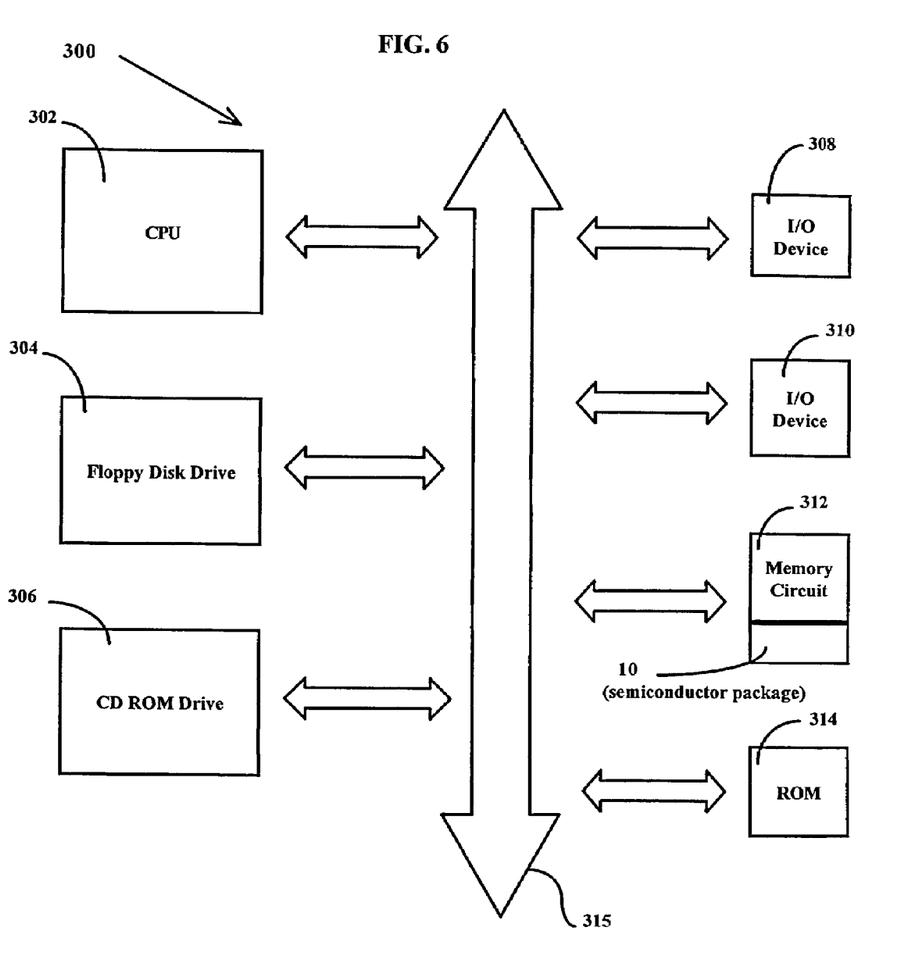
FIG. 6 illustrates a processor-based system constructed in accordance with an embodiment of the present invention.

Referring now to FIG. 6, a device constructed in accordance with the invention can be used in a memory circuit, such as a DRAM device 312, or other electronic integrated circuit, such as a central processing unit (CPU) 302, within a processor-based system 300. The processor-based system 300 may be a computer system, a process control system or any other system employing a processor and associated memory. The system 300 includes the central processing unit (CPU) 302, which may be a microprocessor. The CPU 302 communicates with the DRAM device 312, one or both of which includes the semiconductor package of the invention, over a bus 315. The CPU 302 further communicates with one or more I/O devices 308, 310 over the bus 315. Although illustrated as a single bus, the bus 315 may be a series of buses and bridges commonly used in a processor-based system. Further components of the system 300 may include a read only memory (ROM) device 314, which may also employ the semiconductor package of the invention, and peripheral devices such as a floppy disk drive 304, and CD-ROM drive 306. The floppy disk drive 304 and CD-ROM drive 306 communicate with the CPU 302 over the bus 315.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method of fabricating a semiconductor package, said method comprising:

attaching a first die support structure to a first semiconductor die and a second die support structure to a second semiconductor die, each said support structure including a plurality of conductive fingers;

electrically connecting said fingers of said first die support structure to said first semiconductor die and said fingers of said second die support structure to said second semiconductor die, wherein said fingers of said first die support structure are directly connected to said fingers of said second die support structure; and encapsulating peripheral portions of said dies and said die support structures in a manner which leaves portions of at least one of said dies exposed external to said package as a heat dissipating surface, which leaves a distal portion of at least one of said fingers exposed as a heat dissipating surface and which leaves a cavity between said dies.

2. The method of claim 1, wherein said attaching comprises adhering said die support structures to respective semiconductor dies with an adhering material.

3. The method of claim 1, wherein said electrically connecting comprises wire bonding bond pads on said fingers of said first die support structure to bond pads on said first semiconductor die and wire bonding bond pads on said fingers of said second die support structure to bond pads on said second semiconductor die.

4. The method of claim 1, further comprising positioning spacers between said die support structures.

5. The method of claim 1, wherein said die support structures include an outer boundary, said method further comprising removing said outer boundary to isolate said fingers.

6. The method of claim 5, further comprising the step of bending said isolated fingers.

* * * * *